(12) United States Patent
Chang et al.

(10) Patent No.: US 7,220,496 B2
(45) Date of Patent: May 22, 2007

(54) POLARIZED ELECTROLUMINESCENT LIGHT-EMITTING PANEL AND ITS FABRICATION METHOD

(75) Inventors: Shu-Wen Chang, Nantou County (TW); Wen-Jui Liao, Taichung County (TW); Sherry Lin, Pingtung County (TW)

(73) Assignee: Wintek Corporation, Taichung (TW)

( * ) Notice: Subject to any disclaimer, the term of this patent is extended or adjusted under 35 U.S.C. 154(b) by 222 days.

(21) Appl. No.: 10/937,339

(22) Filed: Sep. 10, 2004

(65) Prior Publication Data

US 2006/0057424 A1 Mar. 16, 2006

(51) Int. Cl.
*H05B 33/02* (2006.01)
*H05B 33/10* (2006.01)
*H01L 51/50* (2006.01)

(52) U.S. Cl. .................. 428/690; 428/917; 427/66; 313/504; 313/506; 257/88; 430/319; 430/321; 438/34

(58) Field of Classification Search .............. 428/690, 428/917, 119; 313/504, 505, 506; 257/88; 430/319, 321; 427/66; 438/34
See application file for complete search history.

(56) References Cited

U.S. PATENT DOCUMENTS 7,059,928 B2 * 6/2006 Ikeda .................... 445/24

\* cited by examiner

*Primary Examiner*—Dawn L. Garrett
(74) *Attorney, Agent, or Firm*—Bacon & Thomas PLLC

(57) ABSTRACT

A polarized electroluminescent light-emitting panel is made by treating the photo-alignable functional group of the polymer hole transporting layer with a first direction and second direction photo-alignment treatment to have the molecules of the hole transporting layer aligned in specific directions and then forming a polymer emitting layer on the hole transporting layer, and thus a thin type full-color polarized electroluminescent light-emitting device that will produce polarized superimposition (3D image) is thus obtained.

9 Claims, 4 Drawing Sheets

POLARIZED ELECTROLUMINESCENT LIGHT-EMITTING PANEL AND ITS FABRICATION METHOD

BACKGROUND OF THE INVENTION

1. Field of the Invention

The present invention relates generally to the component part of a display and more specifically, to a polarized electroluminescent light-emitting panel. The invention relates also to the fabrication method of the polarized electroluminescent light-emitting panel.

2. Description of the Related Art

The formation of a 3D image is determined subject to the viewing of the two eyes on an object from different angles. A 3D image can be produced by two ways. One way is to use two displays to project differently polarized light image on a screen at the same time and then to have the audiences wearing a special pair of eyeglasses to watch the image on the screen through the differently polarized lenses of the eyeglasses. This method requires a big hall and a big video equipment. The other way is to use a liquid crystal display to emit different angles of radioactive beam, enabling the two eyes to receive two images of different parallax. Precision angle control of radioactive beam determines the quality of 3D image. In order to provide a high quality 3D image, advanced liquid crystal displays are made having multiple liquid crystal layers to provide a parallax barrier. However, this multiple liquid crystal layer design greatly increases the total thickness of the display panel and complicates the alignment of the layers.

Therefore, it is desirable to provide a polarized electroluminescent light-emitting panel fabrication method that eliminates the aforesaid drawbacks.

SUMMARY OF THE INVENTION

The present invention has been accomplished under the circumstances in view. It is the main object of the present invention to provide a polarized electroluminescent light-emitting panel fabrication method, which uses material's luminous feature and photo-alignment technology to control the arrangement of the molecules of the hole transporting layer so as to produce a thin type 3D display panel.

To achieve this and other objects of the present invention, the polarized electroluminescent light-emitting panel fabrication method comprising the steps of: (a) preparing a substrate and forming a transparent conducting film on the surface of the substrate, the transparent conducting film being comprised of a anode pattern having a plurality of anodes; (b) making a plurality of upwardly extended ribs in between the anodes to form a retaining wall pattern; (c) using a polymeric hole transporting material having a photo-alignable functional group to make a hole transporting layer in between the ribs; (d) processing the hole transporting layer with a photo-alignment process properly in a first direction and a second direction to have the molecules of the hole transporting layer aligned in the first direction and the second direction; (e) coating polymer light-emitting materials on the alignment and crosslink-treated hole transporting layer to form an emitting layer; and (f) forming a metal cathode layer on the emitting layer.

DETAILED DESCRIPTION OF THE INVENTION

Figure 1:
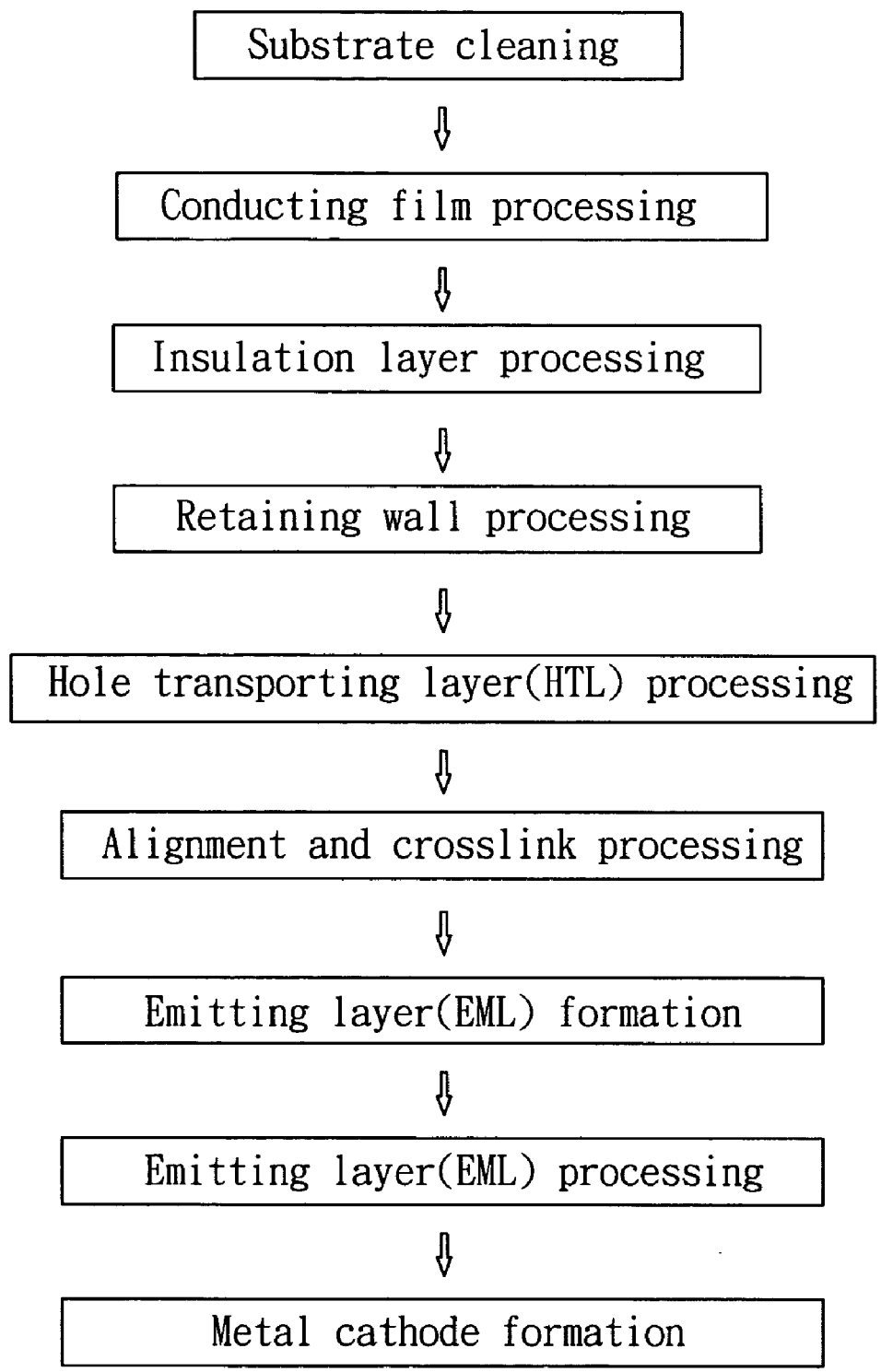
FIG. 1 is a block diagram showing the manufacturing flow of the present invention.
Figure 2:
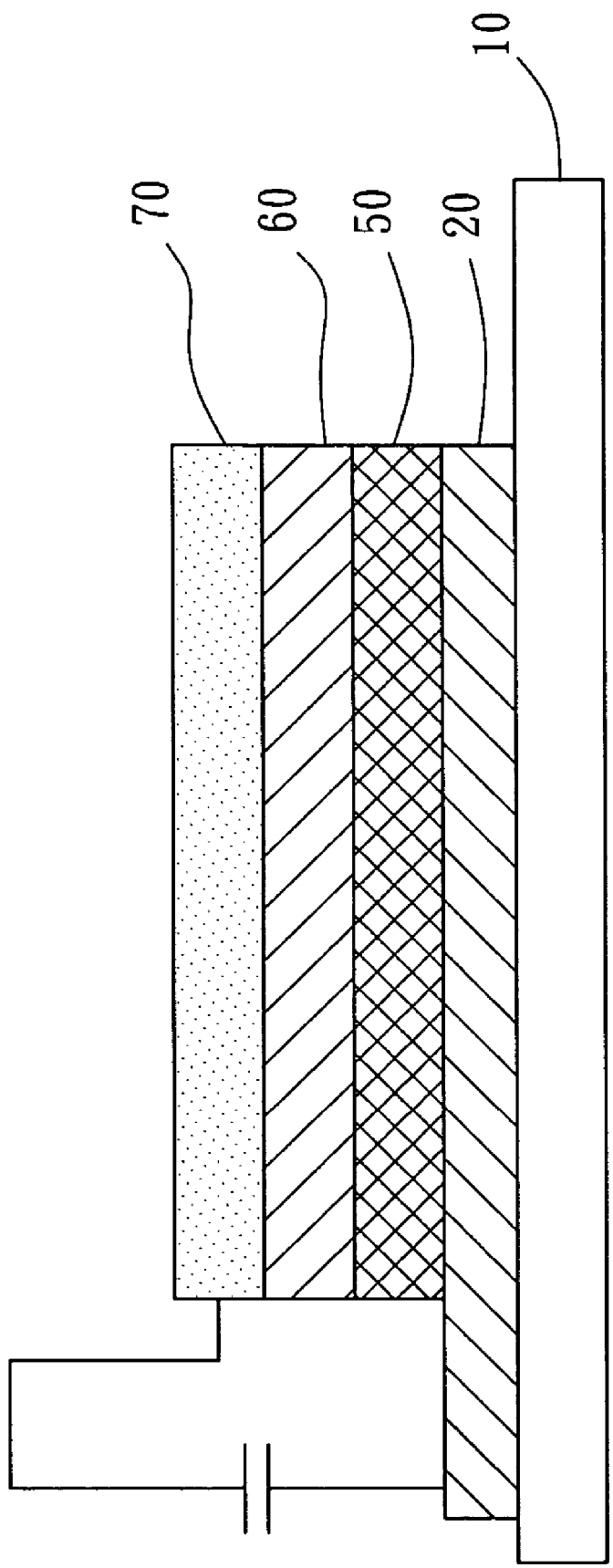
FIG. 2 is a schematic drawing showing the structure of a polarized electroluminescent light-emitting panel according to the present invention.
Figure 3:
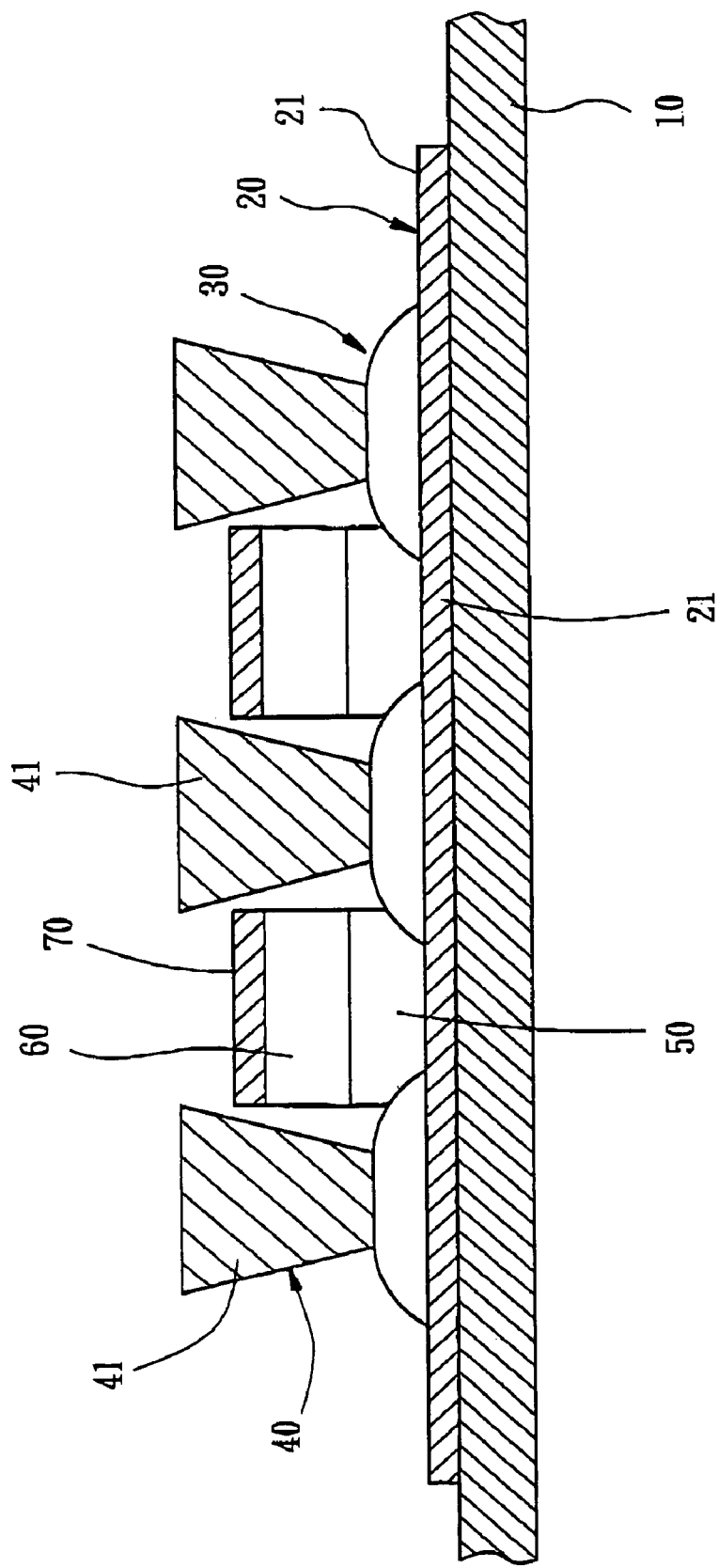
FIG. 3 is a schematic drawing showing the relative arrangement of the components of the polarized electroluminescent light-emitting panel according to the present invention.
Figure 4:
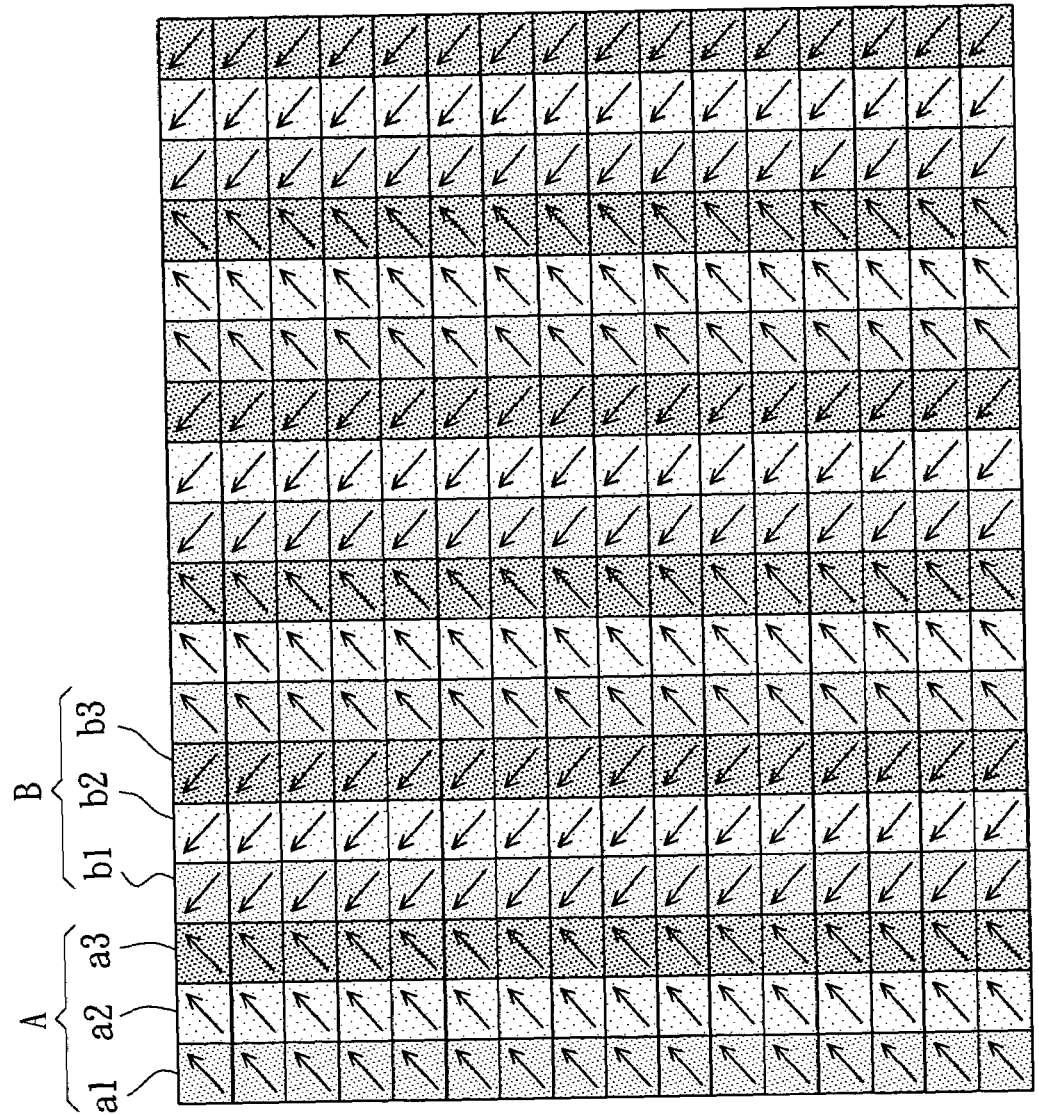
FIG. 4 is a schematic drawing showing the arrangement of the molecules of the hole transporting layer according to the present invention.

Referring to FIGS. 1~4, a polarized electroluminescent light-emitting panel fabrication method in accordance with the present invention comprises the steps of:

(1) Substrate cleaning where:

a polymeric material, for example, PET (Polyethylene Terephthalate) is used to make a substrate 10, and then the substrate 10 is cleaned to remove dirt;

(2) Conducting film processing where:

a transparent conducting film (Indium Tin Oxide film) 20 is deposited in the surface of the substrate 10 and etched into anode pattern 21 (because the film depositing and etching techniques are of the known art, no further detailed description in this regard is necessary);

(3) Insulation layer processing where:

an insulation layer 30 is grown on the surface of the substrate 10 in between the anodes of the anode pattern 21 by photolithography;

(4) Retaining wall processing where:

upwardly extended ribs 41 are made on the insulation layer 30 by advanced mask technology (etching, developing), thereby forming a retaining wall pattern 40;

(5) Hole transporting layer (HTL) processing where:

a hole transporting layer 50 is formed of a polymeric hole transporting material having a photo-alignable functional group (for example, cinnamyl group), preferably, discotic liquid crystal, on the anodes of the anode pattern 21 between each two adjacent ribs 41 by means of ink inject printing;

(6) Alignment and crosslink processing where:

Ultraviolet light is used with mask to radiate a local area of the hole transporting layer 50 in a first direction (the arrowhead signs in zone A in FIG. 4 show discotic liquid crystal molecules arranged in the first direction after photo-alignment), and then ultraviolet light is used with mask again to radiate the other area of the hole transporting layer 50 in a second direction ((the arrowhead signs in zone B in FIG. 4 show discotic liquid crystal molecules arranged in the second direction after photo-alignment), and then the hole transporting layer 50 is processed through a crosslink process to enhance stabilization of the respectively aligned discotic liquid crystal molecules;

(7) Emitting layer (EML) formation where:

Polymer light-emitting materials that are selected from polyfluorence (i.e., red, green, blue organic ink materials) are coated on the alignment and crosslink-treated hole transporting layer 50 by ink inject printing to form an emitting layer 60 (a1 and b1 in zones A and B in FIG. 4 are the areas that emit red light; a2 and b2 are the areas that emit green light; a3 and b3 are the areas that emit blue light);

(8) Emitting layer (EML) processing where:
the emitting layer 60 is treated through an annealing process to have the molecules of the emitting layer 60 be in same alignment with the molecules of the alignment and crosslink-treated hole transporting layer 50, and then the emitting layer 60 and the hole transporting layer 50 are crosslinked so that the light-emitting device of the present invent will emit polarized light; and (9) Metal cathode formation where:
a cathode layer 70 is formed on the emitting layer 60 by evaporation.

After the aforesaid procedure, the polarized electroluminescent light-emitting panel thus obtained is processed through a packaging process and then installed with a driver circuit, and a full-color polarized electroluminescent light-emitting device is thus obtained.

As indicated above, the invention uses material's luminous feature and photo-alignment technology to control the arrangement of the molecules of the hole transporting layer 50 in the first and second directions shown in FIG. 4, so as to obtain polarized superimposition (3D image). Because the light-emitting device of the present invention is made of the present invention uses thin organic materials, the invention can provide a 3D display panel that is relatively thinner than conventional 3D display panels.

Further, poly (3,4-diethylene dioxythiophene) (PEDOT) can also be used for making the hole transporting layer. The formula of poly (3,4-diethylene dioxythiophene) (PEDOT) is as follows:

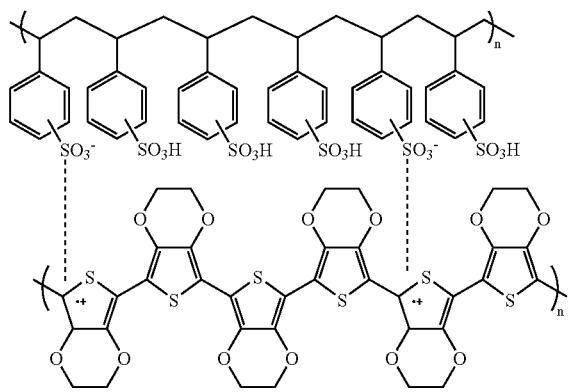

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A polarized electroluminescent light-emitting panel fabrication method comprising the steps of:
   (a) preparing a substrate and forming a transparent conducting film on the surface of said substrate, said transparent conducting film being comprised of a anode pattern having a plurality of anodes;
   (b) making a plurality of upwardly extended ribs in between said anodes to form a retaining wall pattern;
   (c) using a polymeric hole transporting material having a photo-alignable functional group to make a hole transporting layer in between said ribs;
   (d) processing said hole transporting layer with a photo-alignment and crosslinking process properly in a first direction and a second direction to have the molecules of said hole transporting layer aligned in said first direction and said second direction;
   (e) coating polymer light-emitting materials on the alignment and crosslink-treated hole transporting layer to form an emitting layer; and
   (f) forming a metal cathode layer on said emitting layer.

2. The polarized electroluminescent light-emitting panel fabrication method as claimed in claim 1, wherein said polymeric hole transporting material is discotic liquid crystal.

3. The polarized electroluminescent light-emitting panel fabrication method as claimed in claim 2, wherein said photo-alignment process is achieved by using a ultraviolet light with a mask to radiate a predetermined area of said hole transporting layer in a first direction to have the radiated molecules of said hole transporting layer be arranged in said first direction and then using said ultraviolet light with said mask to radiate the other area of said hole transporting layer in a second direction to have the radiated molecules of said hole transporting layer be arranged in said second direction.

4. The polarized electroluminescent light-emitting panel fabrication method as claimed in claim 1, further comprising the step of making an insulation layer after the formation of said conducting layer before the formation of said retaining wall pattern where an electrically insulative material is grown on said substrate in between the anodes of said anode pattern by photolithography for enabling said ribs to be formed on and upwardly extended from said insulation layer.

5. The polarized electroluminescent light-emitting panel fabrication method as claimed in claim 1, wherein said polymer light-emitting materials are selected from polyfluorence.

6. A polarized electroluminescent light-emitting panel comprising:
   a substrate;
   a transparent conducting layer covered on the surface of said substrate, said transparent conducting layer being formed of an anode pattern comprised of a plurality of anodes;
   a retaining wall formed of a plurality of ribs disposed in between said anodes;
   a hole transporting layer formed of a polymeric hole transporting layer having a photo-alignable functional group and covered on the anodes of said anode pattern in between said ribs;
   an emitting layer formed of polymer light-emitting materials and covered on said hole transporting layer; and
   a metal cathode layer covered on said emitting layer.

7. The polarized electroluminescent light-emitting panel as claimed in claim 6, further comprising an insulation layer covered on said substrate in between the anodes of said anode pattern for the growing of said ribs.

8. The polarized electroluminescent light-emitting panel as claimed in claim 6, wherein said polymeric hole transporting material is discotic liquid crystal.

9. The polarized electroluminescent light-emitting panel as claimed in claim 6, wherein said polymer light-emitting materials are polyfluorecne.

* * * * *